United States Patent
Jadidian et al.

(10) Patent No.: US 12,313,431 B2
(45) Date of Patent: *May 27, 2025

(54) SURFACE SENSING VIA RESONANT SENSOR

(71) Applicant: Microsoft Technology Licensing, LLC, Redmond, WA (US)

(72) Inventors: Jouya Jadidian, Los Gatos, CA (US); Scott Francis Fullam, Palo Alto, CA (US); Rune Hartung Jensen, Cupertino, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 151 days.

This patent is subject to a terminal disclaimer.

(21) Appl. No.: 18/182,350

(22) Filed: Mar. 12, 2023

(65) Prior Publication Data

US 2023/0213361 A1   Jul. 6, 2023

Related U.S. Application Data

(63) Continuation of application No. 17/349,711, filed on Jun. 16, 2021, now Pat. No. 11,614,345.

(51) Int. Cl.
*G01D 5/24* (2006.01)
*G06F 3/01* (2006.01)

(52) U.S. Cl.
CPC .............. *G01D 5/24* (2013.01); *G06F 3/012* (2013.01); *G06F 3/014* (2013.01)

(58) Field of Classification Search
CPC .. G01D 5/00; G01D 5/12; G01D 5/14; G01D 5/24; G06F 3/00; G06F 3/01; G06F 3/011; G06F 3/012; G06F 3/014; G06F 3/017; G06F 3/03; G06F 3/033; G06F 3/0346; H03K 17/00; H03K 17/94; H03K 17/945; H03K 17/95; H03K 17/952; H03K 17/9537; H03K 17/954; H03K 17/955
USPC ................................ 324/600, 649, 658, 686
See application file for complete search history.

(56) References Cited

U.S. PATENT DOCUMENTS

| | | | |
|---|---|---|---|
| 5,012,206 A | 4/1991 | Tigges | |
| 10,529,113 B1 | 1/2020 | Sheikh | |
| 10,684,467 B2 | 6/2020 | Gibbs | |
| 11,020,654 B2 | 6/2021 | Sun | |
| 11,555,940 B2* | 1/2023 | Witts | ..................... G01D 5/145 |

(Continued)

FOREIGN PATENT DOCUMENTS

EP    0998659 A1    5/2000

OTHER PUBLICATIONS

U.S. Appl. No. 17/663,111, filed May 12, 2022.
U.S. Appl. No. 17/808,049, filed Jun. 21, 2022.
"Display systems research: Reverse passthrough VR", Retrieved From: https://research.facebook.com/blog/2021/08/ display-systems-research-reverse-passthrough-vr/, Aug. 2, 2021, 7 Pages.

(Continued)

*Primary Examiner* — Hoai-An D. Nguyen
(74) *Attorney, Agent, or Firm* — Alleman Hall & Tuttle LLP

(57) ABSTRACT

Examples are disclosed that relate to sensing a position of a surface proximate to a resonant LC sensor. One example provides a method on a sensing device comprising one or more resonant LC sensors each configured to output a signal responsive to a position of a surface proximate to the resonant LC sensor. The method comprises, for each LC sensor, generating an oscillating signal on an antenna of the resonant LC sensor and detecting a near-field response of the resonant LC sensor at a selected frequency.

20 Claims, 9 Drawing Sheets

(56) References Cited

U.S. PATENT DOCUMENTS

| | | | |
|---|---|---|---|
| 11,614,345 B2* | 3/2023 | Jadidian | G06F 3/014 |
| | | | 324/686 |
| 2009/0219039 A1 | 9/2009 | Fasshauer | |
| 2016/0349839 A1 | 12/2016 | Ohba | |
| 2018/0004478 A1 | 1/2018 | Chen | |
| 2018/0033190 A1 | 2/2018 | Ma | |
| 2019/0212822 A1 | 7/2019 | Keller et al. | |
| 2019/0275419 A1 | 9/2019 | Sun | |
| 2019/0286406 A1 | 9/2019 | Chen | |
| 2019/0325633 A1 | 10/2019 | Miller, IV | |
| 2020/0402284 A1 | 12/2020 | Saragih | |
| 2021/0271316 A1 | 9/2021 | Kozlowski | |
| 2022/0100271 A1 | 3/2022 | Hulbert | |
| 2023/0367002 A1 | 11/2023 | Jakubzak | |
| 2023/0368453 A1 | 11/2023 | Jakubzak | |

OTHER PUBLICATIONS

"International Search Report and Written Opinion Issued in PCT Application No. PCT/US23/013448", Mailed Date: Jun. 28, 2023, 14 Pages.

"Invitation to Pay Additional Fees in PCT Application No. PCT/US23/013448", Mailed Date: Apr. 24, 2023, 9 Pages.

Thies, et al., "FaceVR: Real-Time Gaze-Aware Facial Reenactment in Virtual Reality", In Journal of ACM Transactions on Graphics, vol. 37, Issue 2, Jun. 29, 2018, 15 Pages.

"International Search Report and Written Opinion Issued in PCT Application No. PCT/US22/028879", Mailed Date: Aug. 9, 2022, 14 Pages.

Non-Final Office Action mailed on Aug. 6, 2024, in U.S. Appl. No. 17/808,049, 18 pages.

* cited by examiner

SURFACE SENSING VIA RESONANT SENSOR

CROSS REFERENCE TO RELATED APPLICATIONS

This application is a continuation of U.S. Patent Application Ser. No. 17/349,711, filed Jun. 16, 2021, the entirety of which is hereby incorporated herein by reference for all purposes.

BACKGROUND

Computing devices may track user gestures as a form of input. For example, hand gestures may be tracked via a depth camera, stereo cameras, or an inertial measurement unit (IMU) held by a user. Likewise, head gestures may be tracked via an IMU on a head mounted device.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to sensing a position of a surface proximate to a resonant LC sensor. One example provides, on a sensing device comprising one or more resonant LC sensors each configured to output a signal responsive to a position of a surface proximate to the resonant LC sensor, a method comprising, for each LC sensor, generating an oscillating signal on an antenna of the resonant LC sensor at a selected frequency, and detecting a near-field response of the resonant LC sensor at the selected frequency.

DETAILED DESCRIPTION

A wearable device, such as a head mounted display (HMD) device, may use facial tacking for input. One possible method to perform facial tracking is by using image sensors mounted on the device to capture images of the user's face. However, the integration of cameras into a frame of a wearable device may impact a visual design of the wearable device. Further, cameras may be sensitive to occlusions, such as face masks, head bands, and facial hair.

Accordingly, examples are disclosed that relate to sensing a surface using one or more resonant LC sensors, wherein each resonant LC sensor is configured to output a signal responsive to a position of a surface area proximate to the resonant LC sensor. Briefly, each resonant LC sensor comprises an antenna configured for near-field electromagnetic detection, an amplifier, and an oscillator. Each sensor is operated by generating an oscillating signal on the antenna and detecting a near-field response of the resonant LC sensor at a selected frequency. As explained in more detail below, a resonant frequency of the resonant LC circuit changes as a function of antenna proximity to a surface being sensed, thereby allowing changes in the position of the surface relative to the antenna to be sensed. In some examples, a sensing device may take the form of an HMD device configured to sense facial inputs (including movements and/or postures). As another example, a sensing device may comprise a sensing glove configured to detect finger positions. In other examples, a sensing device can be configured to detect any other suitable surface, including other body parts, as well as surfaces not on a human body (e.g. a stylus proximate to a screen).

Figure 1:
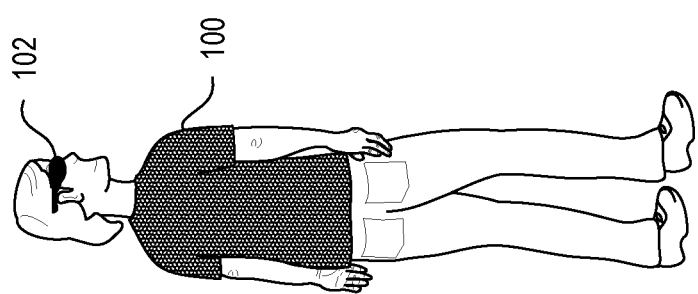
FIG. 1 shows an example sensing device worn by a user.

FIG. 1 illustrates a user 100 wearing an example sensing device 102 in the form of an HMD comprising resonant LC sensors for face tracking. Face tracking may be used, for example, to detect facial inputs made by facial postures and/or gestures. Such inputs may be used to control the HMD, and/or to provide information regarding a user's state (e.g. a current emotional and/or comfort state).

Figure 2:
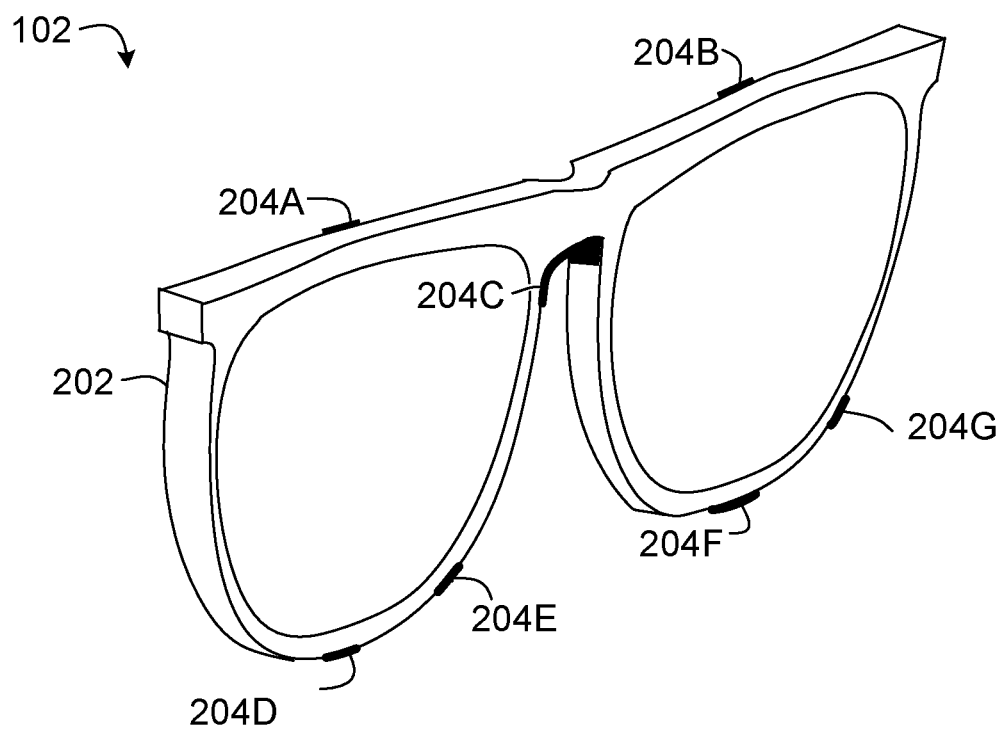
FIG. 2 shows a frame of the sensing device of FIG. 1.

FIG. 2 shows a frame 202 of sensing device 102 in more detail. Frame 202 comprises a resonant sensor array including a plurality of resonant LC sensors 204A-G spatially distributed on the frame 202. Each resonant LC sensor 204 is configured to sense a surface of a face proximate to the corresponding sensor. Each sensor may be configured to sense a different portion of a face, such as a left eyebrow, right eyebrow, nose, left outer check, left inner check, right inner check, and right outer check, as examples. As explained in more detail below, each resonant LC sensor 204 is configured to output a signal that provides information regarding the position of the face proximate to the corresponding resonant LC sensor.

Figure 3:
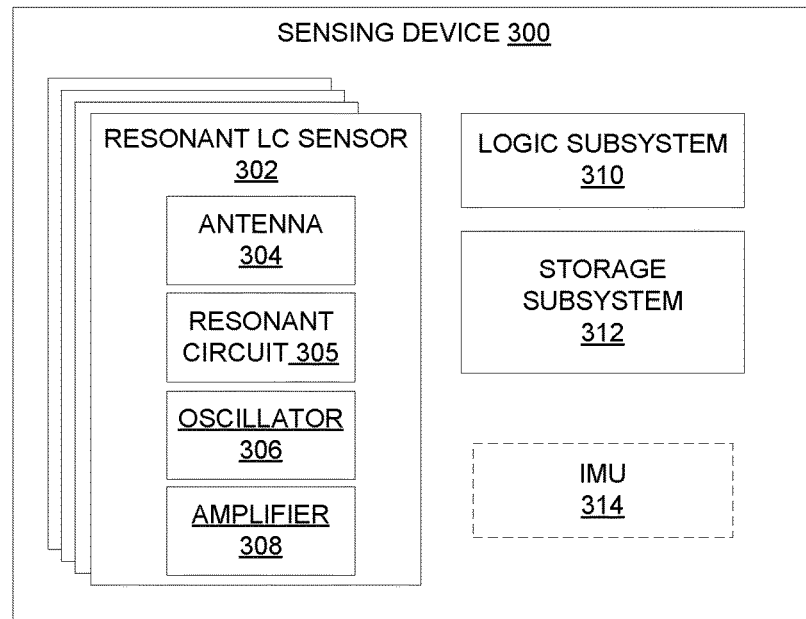
FIG. 3 shows a block diagram of an example sensing device.

FIG. 3 shows a block diagram of an example sensing device 300. In some examples, sensing device 300 may be used for facial sensing. In other examples, sensing device 300 may be used to sense a surface other than a face. Sensing device 102 is an example of sensing device 300.

Sensing device 300 comprises a plurality of resonant LC sensors 302 each configured to output a signal responsive to a position of a surface proximate to the corresponding resonant LC sensor. Each resonant LC sensor comprises an antenna 304, a resonant circuit 305 (wherein the resonant circuit 305 includes capacitance and/or inductance of antenna 304 combined with one or more other reactive components), an oscillator 306, and an amplifier 308.

The antenna 304 is configured for near-field electromagnetic detection, and in some examples may comprise a narrowband antenna with a quality factor in the range of 150 to 2000. The use of a such narrowband antenna may provide for greater sensitivity than an antenna with a lower quality factor. The oscillator 306 and amplifier 308 are configured to generate an oscillating signal on the antenna. In some examples, the oscillating signal is selected to be somewhat offset from a target resonant frequency of the resonant LC sensor (e.g. a resonant frequency that is often experienced during device use, such as a resonant frequency when a face is in a rest state), as such a configuration may provide for lower power operation than where the oscillating signal is more often at the resonant frequency of the resonant LC signal.

Sensing device 300 further comprises a logic subsystem 310 and a storage subsystem 312. In the HMD example, logic subsystem 310 may execute instructions stored in the storage system 312 to control each resonant LC sensor 302, and to determine information regarding the surface (e.g. face tracking data or other surface tracking data) based upon signals received from each resonant LC sensor 302. Where sensing device 300 comprises an HMD, logic subsystem 310 may be configured to detect facial inputs (e.g. motions and/or poses) using any suitable method, such as hard-coded methods and/or machine learning methods. As a more detailed example, the instructions stored in the storage subsystem 312 may be configured to map sensor outputs to a facial gesture and/or posture using a trained machine learning function (e.g. a neural network) that is trained using labeled sensor data for each of a plurality of different facial gestures and/or postures for each of a plurality of users.

Sensing device 300 may further comprise an optional inertial measurement unit (IMU) 314 in some examples. IMU data from the IMU 314 may be used to detect changes in position of the sensing device, and may help to distinguish device movements (e.g. a device being adjusted on or removed from the head) from movements of the surface being sensed (e.g. facial movements).

Figure 4:
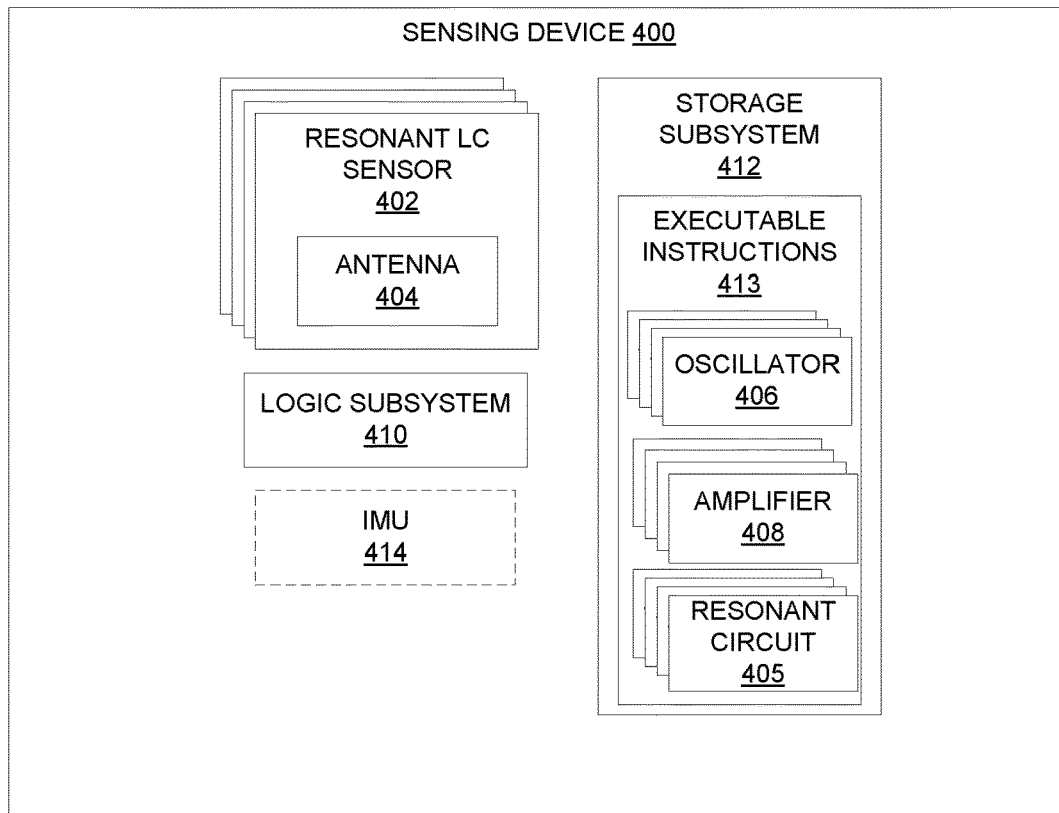
FIG. 4 shows a block diagram of another example sensing device.

FIG. 4 shows another example sensing device 400. Sensing device 400 comprises a plurality of resonant LC sensors 402 each comprising an antenna 404. The antenna 404 may be similarly configured as the antenna shown in FIG. 3. However, in contrast to sensing device 300, sensing device 400 comprises stored instructions 413 executable by the logic subsystem 410 to implement, for each resonant LC sensor 402, a resonant circuit 405, an oscillator 406, and an amplifier 408. Sensing device 400 may further comprise an optional IMU 414, as described above with regard to sensing device 300.

Figure 5:
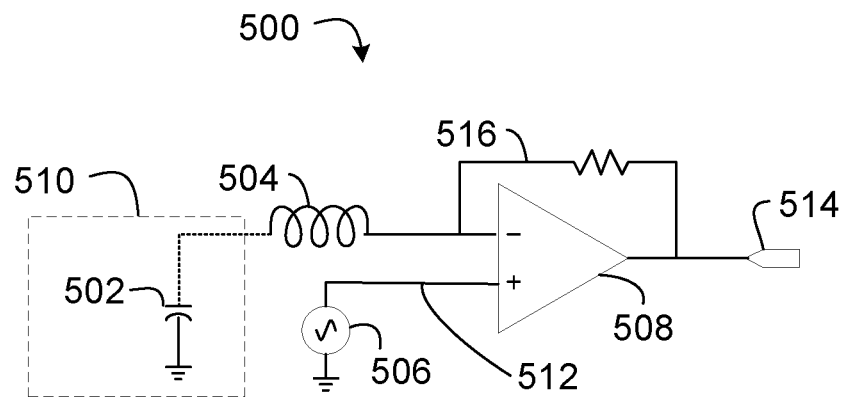
FIG. 5 shows a circuit diagram for an example resonant LC sensor.

FIG. 5 shows a circuit diagram of an example resonant LC sensor 500. Resonant LC sensor 500 may be used as a resonant LC sensor in sensing device 300 of FIG. 3 for example. Resonant LC sensor 500 comprises an inductor 504, an oscillator 506, an amplifier 508, and an antenna 510, the antenna comprising a capacitance represented by capacitor 502. The oscillator 506 is configured to output a driven signal on node 512, and the amplifier 508 is configured to generate an oscillating signal in the antenna based upon the driven signal received at node 512 via feedback loop 516.

The capacitance 502 of the antenna 510 and the inductor 504 form a series resonator. The capacitance of the antenna 510 is a function of a surface proximate to the antenna 510, and thus varies based on changes in a position of the surface proximate to the sensor. Changes in the capacitance at capacitor 502 changes the resonant frequency of the series resonator, which may be sensed as a change in one or more of a phase and an amplitude of a sensor output detected at output node 514. In some examples, a separate capacitor may be included to provide additional capacitance to the resonant circuit, for example, to tune the resonant circuit to a selected resonant frequency.

Figure 6:
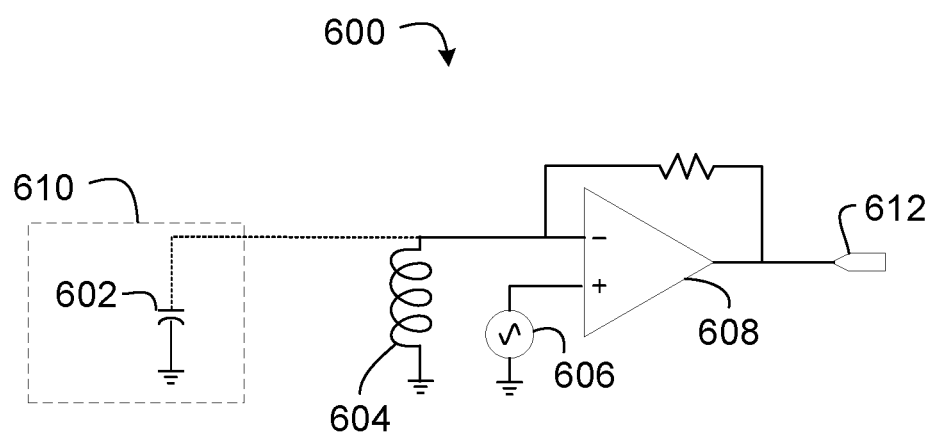
FIG. 6 shows a circuit diagram for another example resonant LC sensor.

FIG. 6 shows a circuit diagram for another example resonant LC sensor 600. Similar to resonant LC sensor 500, resonant LC sensor 600 comprises an oscillator 606, an amplifier 608, and an antenna 610. However, in contrast to resonant LC sensor 500, resonant LC sensor 600 comprises a parallel resonant circuit formed by capacitor 602 (representing a capacitance of the antenna 610 plus any other capacitors included in the circuit) and an inductor 604. The capacitance represented by capacitor 602 is configured to change based on a change in a position of the surface proximate to the antenna 610, causing a resonant frequency of the parallel resonant circuit to change. Changes in the resonant frequency can be detected at node 612.

Figure 7A:
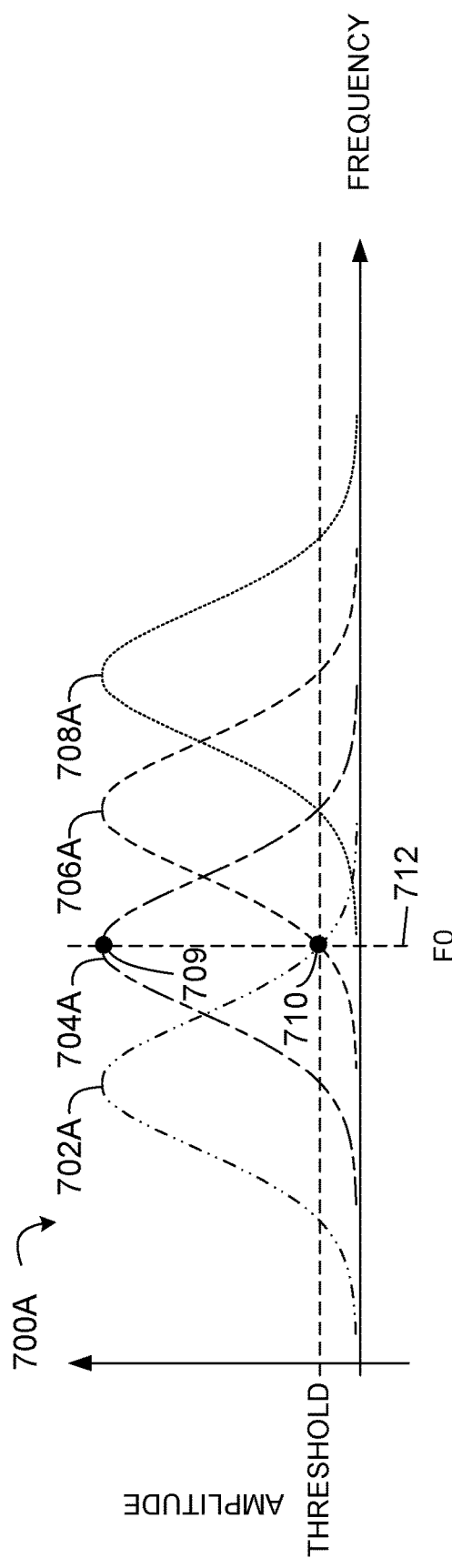
FIG. 7A illustrates a graph of a modeled and experimental signal amplitude versus frequency for an example resonant LC sensor.
Figure 7B:
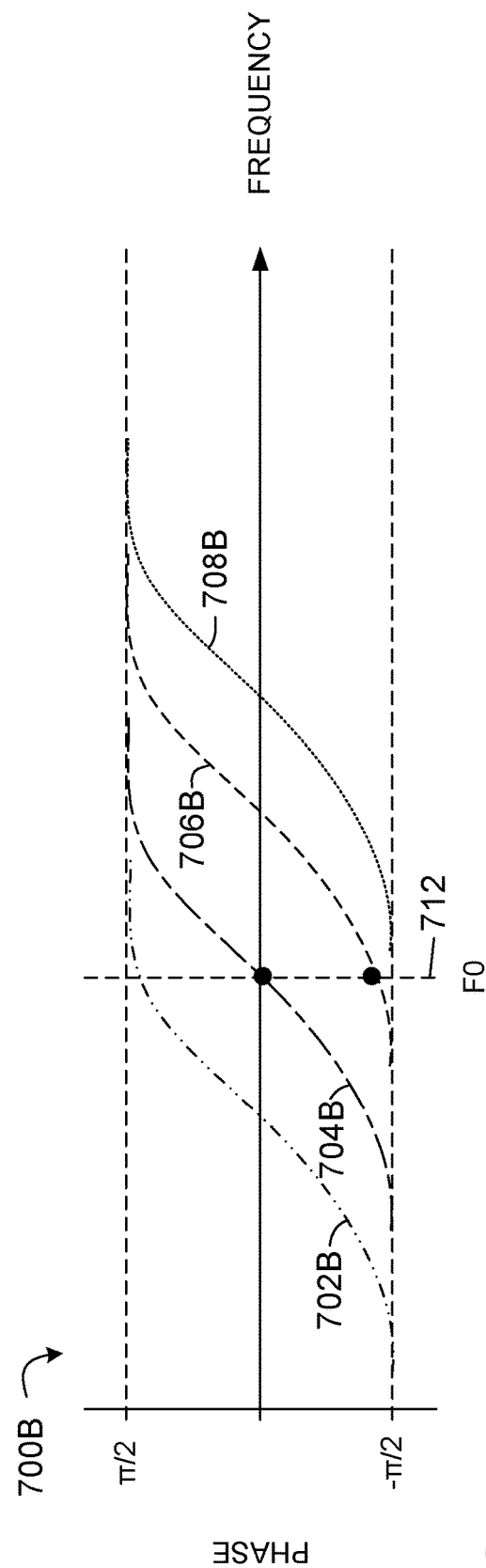
FIG. 7B illustrates a graph of a modeled and experimental signal phase versus frequency for an example resonant LC sensor.

As previously stated, a proximity of a sensed surface to a resonant LC sensor varies the near-field response of the resonant LC sensor, which can be detected as changes in the phase and/or amplitude of the resonant LC sensor at a selected frequency. The phase information relates to a phase relationship between an oscillator of the LC resonant sensor and the near-field response on a LC resonant circuit of the resonant LC sensor. FIG. 7A and FIG. 7B show an example modeled and experimental amplitude versus frequency graph 700A and an example modeled and experimental phase versus frequency graph 700B, respectively. Graphs 700A and 700B show the response of a series resonant LC sensor, such as sensor 500, to four different surface proximities as signal 702, signal 704, signal 706, and signal 708, where the suffix A (e.g. 702A) represents amplitude and the suffix B (e.g. 702B) represents phase information. Output signals for different surface proximities have different associated phases and amplitudes at the selected oscillator frequency $f_0$. For example, signal 702, representing a first surface proximity, comprises associated amplitude plot 702A as a function of frequency, and an associated phase plot 702B as a function of frequency. Similarly, signals 704, 706, and 708 comprise different associated amplitude and phase plots, each corresponding to different surface proximities.

Signal 708 may correspond, for example, to a surface proximity outside of a detection range at a selected frequency 712. The detection range in the depicted example corresponds to a range in which an output signal amplitude value is greater than or equal to a threshold value at the selected frequency, illustrated at 710. Both signal 702A and signal 706A have an amplitude value equal to the threshold value at the selected frequency and represent a range of signal center frequencies that are within a detection range. Any suitable frequency may be used as the selected frequency output by the oscillator. In some examples, a resonant LC sensor may be configured to have a resonant frequency in a range of 100 KHz to 1 MHz, and the selected frequency is sufficiently close to the resonant frequency to detect surface movements based upon changes in the resonant frequency of the resonant LC sensor.

Signal 702 is within an inductive regime of the resonant LC sensor and corresponds to an inductance dominating the series resonator. In contrast, signal 706 is within a capacitance regime of the LC resonant sensor, corresponding to a capacitance dominating the series resonator.

The amplitude of the response of the series resonator has an associated power at the selected frequency. The higher the amplitude at the selected frequency, the more power is consumed by the series resonator. In this example, signal 704A has a center frequency at the selected frequency 712 and represents a peak power of the series resonator, as shown at 709. In contrast, signals 702A and 706A, respectively in the aforementioned inductive and capacitive regimes, have center frequencies different than the selected frequency 712, and thus operate at lower power at the selected frequency 712 than signal 704A. As can be seen in these figures, a signal within a capacitive or inductive regime of a resonant LC sensor may be sensitive to a change in a position of a surface proximate when the surface proximity produces a resonant frequency within a detection range on either side of the selected frequency, and the change in position may be detected by measuring one or more of an amplitude and a phase of a signal output at the selected frequency.

Figure 8:
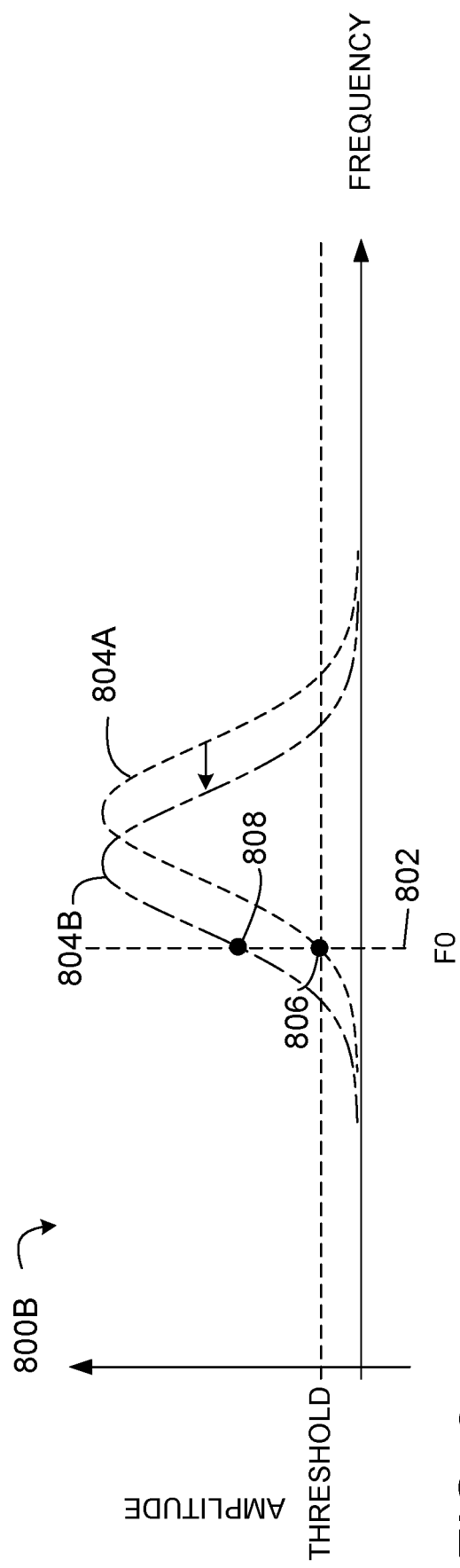
FIG. 8 illustrates an example response of an amplitude of a signal output by a resonant LC sensor to a change in a position of a surface proximate to the resonant LC sensor.

FIG. 8 illustrates a change in an amplitude of a signal output by a resonant LC sensor at a selected frequency as a surface proximate to the resonant LC sensor moves relative to the sensor. In this example, facial movements proximate to the resonant LC sensor move the center frequency of the amplitude signal toward the selected frequency, illustrated by trace 804A and 804B, causing an increase in the signal amplitude at 808 at the selected frequency. While FIG. 8 illustrates operation of a resonant LC sensor in a capacitive regime, in other examples a resonant LC sensor may be configured to operate in an inductive regime. In yet other examples, a resonant LC sensor may be configured to operate both within the capacitive regime and within the inductive regime. In such examples, phase information may be used to determine the regime (capacitive or inductive) in which a detected amplitude output is located.

Figure 9:
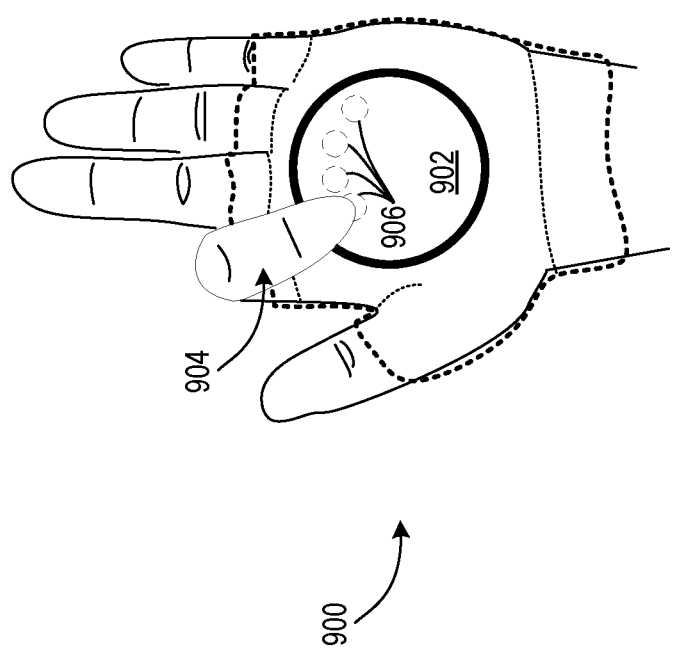
FIG. 9 shows an example sensing device incorporated into a sensing glove.

As mentioned above, a resonant LC sensor may be used in other sensing devices than an HMD. FIG. 9 shows an example sensing glove 900 comprising a sensing device 902 located in a palm area of the sensing glove 900. The sensing glove 900 is configured to sense one or more fingers, such as finger 904, being bent towards one or more resonant LC sensors 906 on sensing device 902. The sensing device 902 may further comprise an active shield, such as a ground plane, configured to provide isolation, such as the sensing device 902 from the palm or between different channels of the sensing device. As described above, each resonant LC sensor 906 may be configured to output a signal responsive to a position of the finger proximate to the corresponding sensor. In some examples, one or more resonant LC sensors 906 each may be configured to operate as a touch sensor and output a signal responsive to a finger touching the sensor. While depicted herein in the forms of a HMD and sensing glove, in other examples a sensing device may take any other suitable form, including non-wearable forms and in forms configured to sense surface other than surfaces on a human body.

Figure 10:
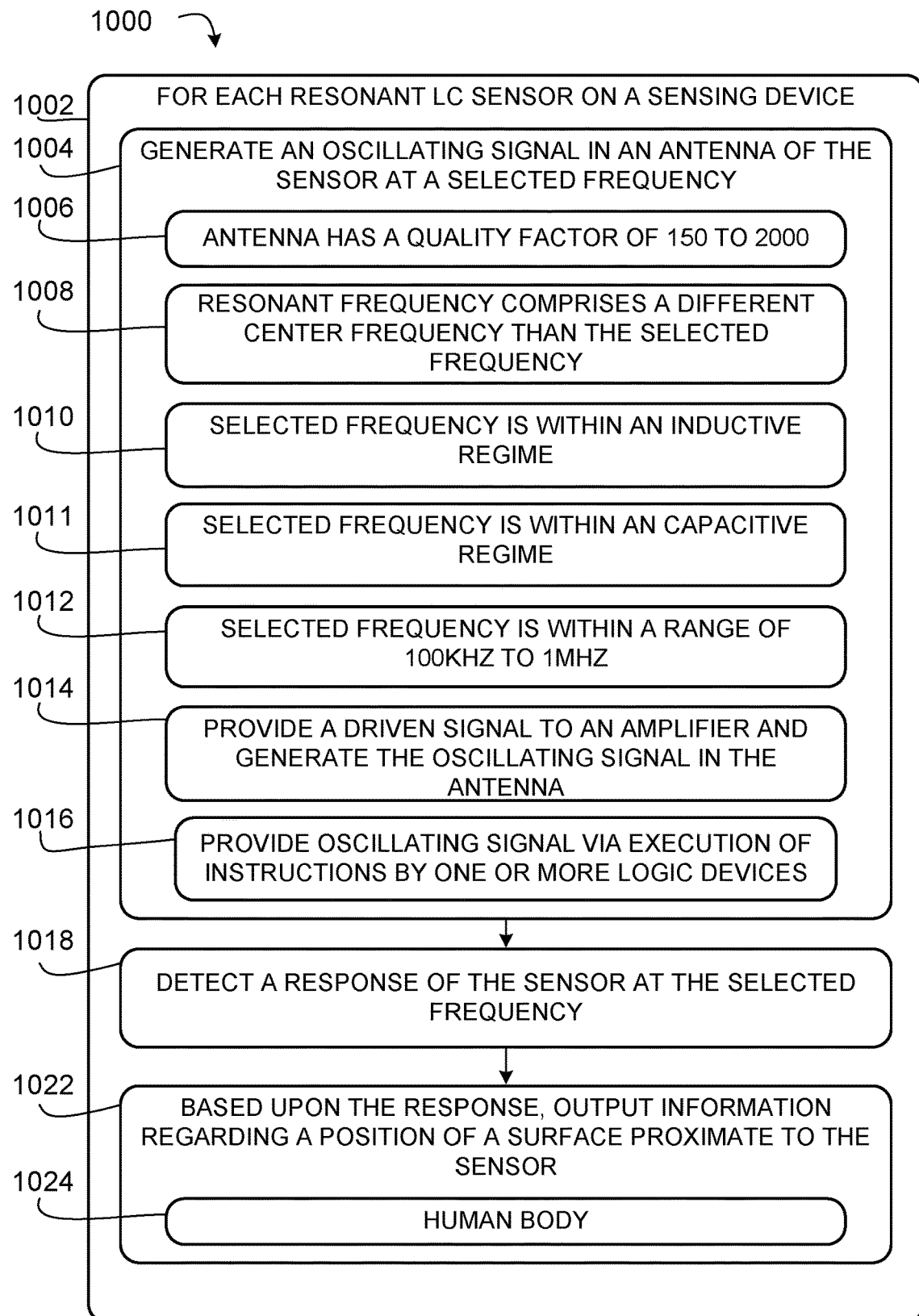
FIG. 10 shows a flow diagram illustrating an example method for sensing a position of a surface proximate to a resonant LC sensor.

FIG. 10 shows a block diagram of an example method 1000 for sensing a surface proximate to a resonant LC sensor. Method 1000 may be performed by any suitable sensing device according to the present disclosure, including the examples of FIGS. 1-6 and FIG. 9. Method 1000 may be performed for each of one or more resonant LC sensors on a sensing device, as indicated at 1002. Method 1000 comprises, at 1004, generating an oscillating signal on an antenna of the resonant LC sensor at a selected frequency. The antenna may comprise a capacitance that is a function of a proximity of a surface to an antenna of the sensor. In some examples, the antenna may comprise a narrowband antenna, at 1006, such as an antenna having a quality factor within a range of 150 to 2000. In some examples, a resonant frequency of the resonant LC sensor may comprise a different center frequency than the selected frequency, as indicated at 1008. Further, in some examples, the selected frequency may be within an inductive regime of the resonant LC sensor, at 1010. In other examples the selected frequency may be within a capacitive regime of the resonant LC sensor, as shown at 1011. In some examples, the selected frequency may comprise a low frequency such as within a range of 100 KHz to 1 MHz, at 1012. In other examples, other suitable frequencies may be used.

In some examples, generating the oscillating signal to the antenna comprises, at 1014, providing a driven signal to an amplifier of the resonant LC sensor, which causes the amplifier to generate the oscillating signal in the antenna. In other examples, the oscillating signal may be provided to the antenna via execution of stored software and/or firmware instructions by one or more logic devices, at 1016.

Continuing, method 1000 further comprises, at 1018, detecting a response of the resonant LC sensor at the selected frequency. Method 1000 further comprises at 1022, based upon the response of the resonant LC sensor, outputting information regarding a position of a surface proximate to the sensor. The information may comprise a phase and/or an amplitude of the response. In some cases, the surface may comprise, at 1024, a surface of a human body, such as a face or a finger. In other cases, any other suitable surface may be sensed, including surfaces not on a human body.

In some examples, the methods and processes described herein may be tied to a computing system of one or more computing devices. In particular, such methods and processes may be implemented as a computer-application program or service, an application-programming interface (API), a library, and/or other computer-program product.

Figure 11:
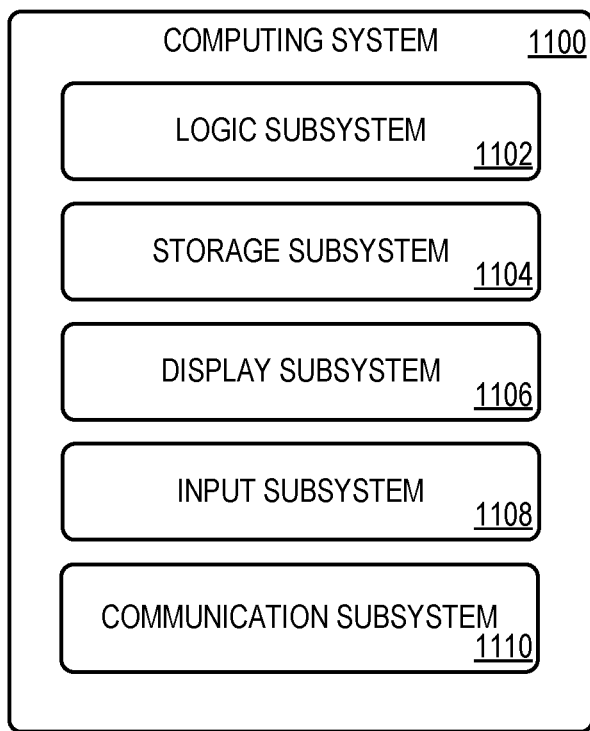
FIG. 11 shows an example computing system.

FIG. 11 schematically shows a block diagram of an example computing system 1100 that can enact one or more of the methods and processes described above. Computing system 1100 is shown in simplified form. Computing system 1100 may take the form of one or more personal computers, server computers, tablet computers, home-entertainment computers, network computing devices, gaming devices, mobile computing devices, mobile communication devices (e.g., smart phone), and/or other computing devices.

Computing system 1100 includes a logic subsystem 1102 and a storage subsystem 1104. Computing system 1100 may optionally include a display subsystem 1106, input subsystem 1108, communication subsystem 1110, and/or other components not shown in FIG. 11.

Logic subsystem 1102 includes one or more physical devices configured to execute instructions. For example, the logic machine may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic machine may include one or more processors configured to execute software instructions. Additionally or alternatively, the logic machine may include one or more hardware or firmware logic machines configured to execute hardware or firmware instructions. Processors of the logic machine may be single-core or multi-core, and the instructions executed thereon may be configured for sequential, parallel, and/or distributed processing. Individual components of the logic machine optionally may be distributed among two or more separate devices, which may be remotely located and/or configured for coordinated processing. Aspects of the logic machine may be virtualized and executed by remotely accessible, networked computing devices configured in a cloud-computing configuration.

Storage subsystem 1104 includes one or more physical devices configured to hold instructions executable by the logic machine to implement the methods and processes described herein. When such methods and processes are implemented, the state of storage subsystem 1104 may be transformed—e.g., to hold different data.

Storage subsystem 1104 may include removable and/or built-in devices. Storage subsystem 1104 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage subsystem 1104 may include volatile, nonvolatile, dynamic, static, read/write, read-only, random-access, sequential-access, location-addressable, file-addressable, and/or content-addressable devices.

It will be appreciated that storage subsystem 1104 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 1102 and storage subsystem 1104 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 1106 may be used to present a visual representation of data held by storage subsystem 1104. This visual representation may take the form of a graphical user interface (GUI). As the herein described methods and processes change the data held by the storage machine, and thus transform the state of the storage machine, the state of display subsystem 1106 may likewise be transformed to visually represent changes in the underlying data. Display subsystem 1106 may include one or more display devices utilizing virtually any type of technology. Such display devices may be combined with logic subsystem 1102 and/or storage subsystem 1104 in a shared enclosure, or such display devices may be peripheral display devices.

When included, input subsystem 1108 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 1110 may be configured to communicatively couple computing system 1100 with one or more other computing devices. Communication subsystem 1110 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 1100 to send and/or receive messages to and/or from other devices via a network such as the Internet.

Another example provides on a sensing device comprising one or more resonant LC sensors each configured to output a signal responsive to a position of a surface proximate to the resonant LC sensor, a method comprising for each resonant LC sensor, generating an oscillating signal on an antenna of the resonant LC sensor at a selected frequency, and detecting a near-field response of the resonant LC sensor at the selected frequency. In some examples, the antenna alternatively or additionally comprises a quality factor within a range of 150 to 2000. In some examples, the selected frequency alternatively or additionally is within a capacitive regime of the resonant LC sensor. In some examples, the selected frequency alternatively or additionally is within an inductive regime of the resonant LC sensor. In some examples, the selected frequency alternatively or additionally comprises a frequency within a range of 100 KHz to 1 MHz. In some examples, the sensing device is alternatively or additionally configured as a wearable device. In some examples, generating the oscillating signal alternatively or additionally comprises providing a driven signal to an amplifier, and generating the oscillating signal on the antenna via the amplifier. In some examples, detecting the near-field response of the resonant LC sensor alternatively or additionally comprises detecting one or more of an amplitude or a phase of an output of the resonant LC sensor.

Another example provides a device comprising a frame and one or more resonant LC sensors supported by the frame, each resonant LC sensor configured to output a signal responsive to a position of a surface proximate to the resonant LC sensor. Each resonant LC sensor comprising an antenna configured for near-field electromagnetic detection, an amplifier, and an oscillator. In some examples, the antenna alternatively or additionally comprises a quality factor within a range of 150 to 2000. In some examples, the antenna alternatively or additionally comprises one or more of a series resonator or a parallel resonator. In some examples, the device is alternatively or additionally configured to be worn on a human head. In some examples, the oscillator and the antenna are alternatively or additionally each connected to a corresponding input of the amplifier. In some examples, the oscillator is alternatively or additionally configured to output a driven signal to the amplifier. In some examples, the one or more resonant LC sensors alternatively or additionally comprises a plurality of resonant LC sensors distributed on the frame.

Another example provides a wearable device comprising a frame configured to be worn on a human head, and a resonant sensor array configured for facial sensing, the resonant sensor array comprising a plurality of resonant LC sensors spatially distributed on the frame, each resonant LC sensor configured to sense a position of a portion of a face proximate to the resonant LC sensor. Each sensor comprising an antenna configured for near-field low-frequency electromagnetic detection, an amplifier, and an oscillator. In some examples, the antenna alternatively or additionally comprises a quality factor within a range of 150 to 2000. In some examples, the oscillator and the amplifier are alternatively or additionally configured to generate an oscillating signal on the antenna within a capacitive regime of the resonant LC sensor. In some examples, the oscillator and the amplifier are alternatively or additionally configured to generate an oscillating signal on the antenna within an inductive regime of the resonant LC sensor. In some examples, the oscillator is alternatively or additionally configured to generate an oscillating signal on the antenna comprising a frequency within a range of 100 KHz to 1 MHz.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. On a sensing device comprising one or more sensors each comprising an antenna and an amplifier, a method comprising:
   for each sensor:
   providing a driven signal to a first input of the amplifier;
   generating an oscillating signal on the antenna at a selected frequency via a second input of the amplifier; and
   detecting a change in a capacitance on the antenna at the selected frequency.

2. The method of claim 1, wherein the antenna comprises a quality factor within a range of 150 to 2000.

3. The method of claim 1, further comprising, determining a position of a surface proximate to the antenna based on the change in the capacitance.

4. The method of claim 3, wherein the surface proximate to the antenna is a surface of a face, and wherein determining the position of the surface proximate to the antenna comprises determining face tracking data based on the change in the capacitance.

5. The method of claim 4, further comprising controlling a portion of the device based at least upon the face tracking data.

6. The method of claim 1, wherein detecting the change in the capacitance on the antenna at the selected frequency comprises detecting a change in a resonant frequency of the sensor.

7. The method of claim 1, wherein the selected frequency comprises a frequency within a range of 100 KHz to 1 MHz.

8. The method of claim 1, wherein the sensing device is configured as a wearable device.

9. A device comprising:
   a frame; and
   one or more sensors supported by the frame, each sensor comprising:
   an antenna having a capacitance that is a function of a proximity to a surface to the antenna,
   an amplifier comprising a first input configured to generate an oscillating signal on the antenna based on a second input of the amplifier, and
   an oscillator configured to provide a driven signal to the second input of the amplifier.

10. The device of claim 9, wherein the antenna comprises a quality factor within a range of 150 to 2000.

11. The device of claim 9, wherein the one or more sensors comprises a plurality of sensors distributed on the frame.

12. The device of claim 11, further comprising an active shield configured to provide electrical isolation of the plurality of sensors.

13. The device of claim 9, further comprising a storage system comprising instructions executable by a logic system to determine a position of a surface proximate to the sensor based on the capacitance on the antenna.

14. The device of claim 13, wherein the instructions are further executable to determine face tracking data based on the position of the surface proximate to the sensor.

15. The device of claim 9, wherein the frame is configured to be worn on a human head.

16. The device of claim 9, wherein the device comprises a sensing glove.

17. A wearable device comprising:
   a frame configured to be worn on a human head; and
   a sensor array configured for facial sensing, the sensor array comprising a plurality of sensors spatially distributed on the frame, each sensor comprising:
   an antenna having a capacitance that is a function of a proximity to a surface of a face to the antenna,
   an amplifier comprising a first input configured to generate an oscillating signal on the antenna based on a second input of the amplifier, and
   an oscillator configured to provide a driven signal to the second input of the amplifier.

18. The wearable device of claim 17, wherein the antenna comprises a quality factor within a range of 150 to 2000.

19. The wearable device of claim 17, further comprising a storage system comprising instructions executable by a logic system to determine a position of the surface of the face proximate to the antenna based on the capacitance on the antenna.

20. The wearable device of claim 17, further comprising an active shield configured to provide electrical isolation of the plurality of sensors.

* * * * *